US006291252B1

(12) United States Patent
Yu et al.

(10) Patent No.: US 6,291,252 B1
(45) Date of Patent: Sep. 18, 2001

(54) AUTOMATIC METHOD TO ELIMINATE FIRST-WAFER EFFECT

(75) Inventors: Allen S. Yu, Fremont; Paul J. Steffan, Elk Grove, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/345,175

(22) Filed: Jun. 30, 1999

(51) Int. Cl.[7] .................................................. H01L 21/00
(52) U.S. Cl. .............................. 438/5; 29/25.01; 414/217
(58) Field of Search ............................... 438/5, 689, 706, 438/710, 907, 908; 414/217; 29/25.01

(56) References Cited

U.S. PATENT DOCUMENTS 5,819,434 * 10/1998 Herchen et al. .
5,882,165 * 3/1999 Maydan et al. .
5,990,010 * 11/1999 Berman .
6,017,820 * 1/2000 Ting et al. .

* cited by examiner

Primary Examiner—Charles Bowers
Assistant Examiner—Stephen W. Smoot
(74) Attorney, Agent, or Firm—H. Donald Nelson

(57) ABSTRACT

A method of manufacturing semiconductor wafers in a processing tool in which it is determined whether the tool has been on idle beyond a predetermined period of time. If the tool has not been on idle beyond the predetermined period of time, a product wafer is automatically processed. If the tool has been on idle beyond the predetermined period of time, a conditioning wafer is automatically processed.

4 Claims, 5 Drawing Sheets

AUTOMATIC METHOD TO ELIMINATE FIRST-WAFER EFFECT

BACKGROUND OF THE INVENTION

1. Field of the Invention

This invention relates generally to the manufacture of high performance semiconductor integrated devices. More specifically, this invention relates to the control of tools utilized in the manufacture of high performance semiconductor integrated devices. Even more specifically, this invention relates to the avoidance of the first-wafer effect during the manufacture of high performance semiconductor integrated devices.

2. Discussion of the Related Art

The manufacture of high performance semiconductor integrated devices is done on and in semiconductor wafers that are processed through a multitude of processes. Some of these processes include ion implantation, thermal annealing, the formation of photoresist layers, developing the photoresist layer, etching layers, planarizing the surface of the semi-processed semiconductor wafer and depositing layers of different types of materials. As is known in the semiconductor manufacturing art, the above-delineated processes are just a few of the many processes necessary to completely process a semiconductor wafer.

In some of the above processes wafers are placed in a wafer cassette so that they can be handled and moved expeditiously. Typically, a wafer cassette holds about 25 wafers.

During the manufacturing process of the semiconductor wafers there are occasions when one or more of the tools in the process either breaks down or needs maintenance. This causes the manufacturing processes up to the tool that requires maintenance to be stopped. As can be appreciated, the processes in tools that are still operational are completed and the tools are put on idle. The idle state for the different tools affects the various tools in different ways.

For example, when an etch tool sits idle for an extended period of time, the first few product wafers that are processed through the tool end up with less than optimal processing often necessitating scrapping at least the first product wafer, if not the first few product wafers. These wafers need to be scrapped because they may have the critical dimensions sufficiently outside control limits, bridged features, and/or other yield killing problems. In the semiconductor manufacturing industry, this phenomenon is known as the first-wafer effect.

The first-wafer effect occurs when a chamber in a processing tool is left under idle conditions with varying amounts of materials such as residual gas mixtures and/or polymer forming materials. During the idle state, the chamber remains under vacuum and continuously purges polymer building residual gas mixtures, which were left over from previous wafer processing. This causes the chamber that was left idling to be in a different state than a chamber that has been undergoing continuous processing. The problem with this is that processing parameters are characterized with etch tools that are running in a continuous mode. So at least the first wafer processed in a tool such as a plasma etcher that has been idle will undergo processing that is not tuned for the actual conditions of the etch chamber.

One of the techniques to avoid the first-wafer effect is to manually insert one or more conditioning wafers prior to the product wafers to stimulate and exercise the tool before the product wafers actually get etched. Although this measure is effective in some cases, it is not efficient or reliable to have it done manually. Some of the reasons that it is not effective are:

1. The tool operators often forget to insert the conditioning wafer.
2. Extra manual conditioning wafer insertions in front of the product wafers may cause random killer defects such as scratches and particle contamination to the product wafers and to the tool.
3. The tool may be paused for a long period of time when unattended due to soft error such as temperature and/or pressure stability and will repeat the phenomenon when resumed.
4. The tool operators often forget to reload the proper recipe for the product wafers after the conditioning wafer(s) have been completed.
5. It is difficult for the tool operator to know for sure that a conditioning wafer is needed.

A common and serious problem of the first-wafer effect occurs when the tool is paused after partially processing the lot. It requires the tool operator to make the decision whether or not to repeat the conditioning cycle. To repeat the cycle, the processed wafers must be retrieved manually from the processing chamber and returned to the cassette, mixing them with unprocessed wafers. Since processed wafers should be kept in a constant vacuum, the prolonged exposure to the atmosphere will allow condensation and corrosion to occur that will degrade the reliability of the devices. In addition, there is a high likelihood that misprocessing will occur when the lot resumes processing.

To reduce cost, the conditioning wafers are typically made from previously used, non-patterned wafers, known as dummy wafers. The dummy wafers have a single film layer over the substrate, bare silicon and photoresist coated to simulate as closely as possible the multiple layers of the product wafers.

For product wafers, etch endpoint detectors are assigned to detect when a change of a layer or material occurs before the next etch step is introduced. Because the conditioning wafer has a different film, for example bare silicon rather than an aluminum metal layer, the tool will alarm and the conditioning cycle will pause since the appropriate endpoint signal will not have been detected. Because of the built-ill endpoint alarms, the tool operator has to wait in front of the tool to intervene after each processing step that includes an endpoint. This reduces the throughput and increases the cost of manufacturing. For this reason, it is difficult to process both conditioning wafers and product wafers with a single recipe. To resolve this problem, a modified process recipe without the use of endpoint detectors has been employed to prevent an alarm situation. However, this practice can lead to the problems listed above and result in wafers that have to be scrapped.

Another remedy is to have conditioning wafers run automatically at the beginning of each lot of product wafers. However, this is very time consuming, especially when lots are continuously loaded one after another. This is even more wasteful when each lot contains only a few wafers instead of a complete batch of 25 wafers. As discussed above, a single conditioning wafer and sometimes multiple conditioning wafers are required before each product lot when the tool has been idle. If the tool had been idle for an extended period of time, insufficient conditioning can result in scrapping wafers while over conditioning increases cost and cycle time.

Therefore, what is needed is a method to prevent the first-wafer effect that does not run conditioning wafers unnecessarily and does not over condition the processing tool.

SUMMARY OF THE INVENTION

According to the present invention, the foregoing and other objects and advantages are obtained by a method of manufacturing semiconductor wafers in which product wafers and conditioning wafers are loaded into a processing tool and in which it is determined if the processing tool has been on idle for a predetermined period of time.

In one aspect of the invention, a product wafer is automatically processed if the predetermined period of time has not been exceeded.

In another aspect of the invention, a conditioning wafer is automatically processed if the predetermined period of time has been exceeded.

In another aspect of the invention, product wafers are automatically processed if the predetermined period of time has not been exceeded prior to the next wafer being processed.

In another aspect of the invention, conditioning wafers are automatically processed if the previous conditioning wafer does not fully condition the processing tool.

The described method thus provides a method of manufacturing semiconductor devices automatically without running unnecessary conditioning wafers thus saving processing time and increasing throughput.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
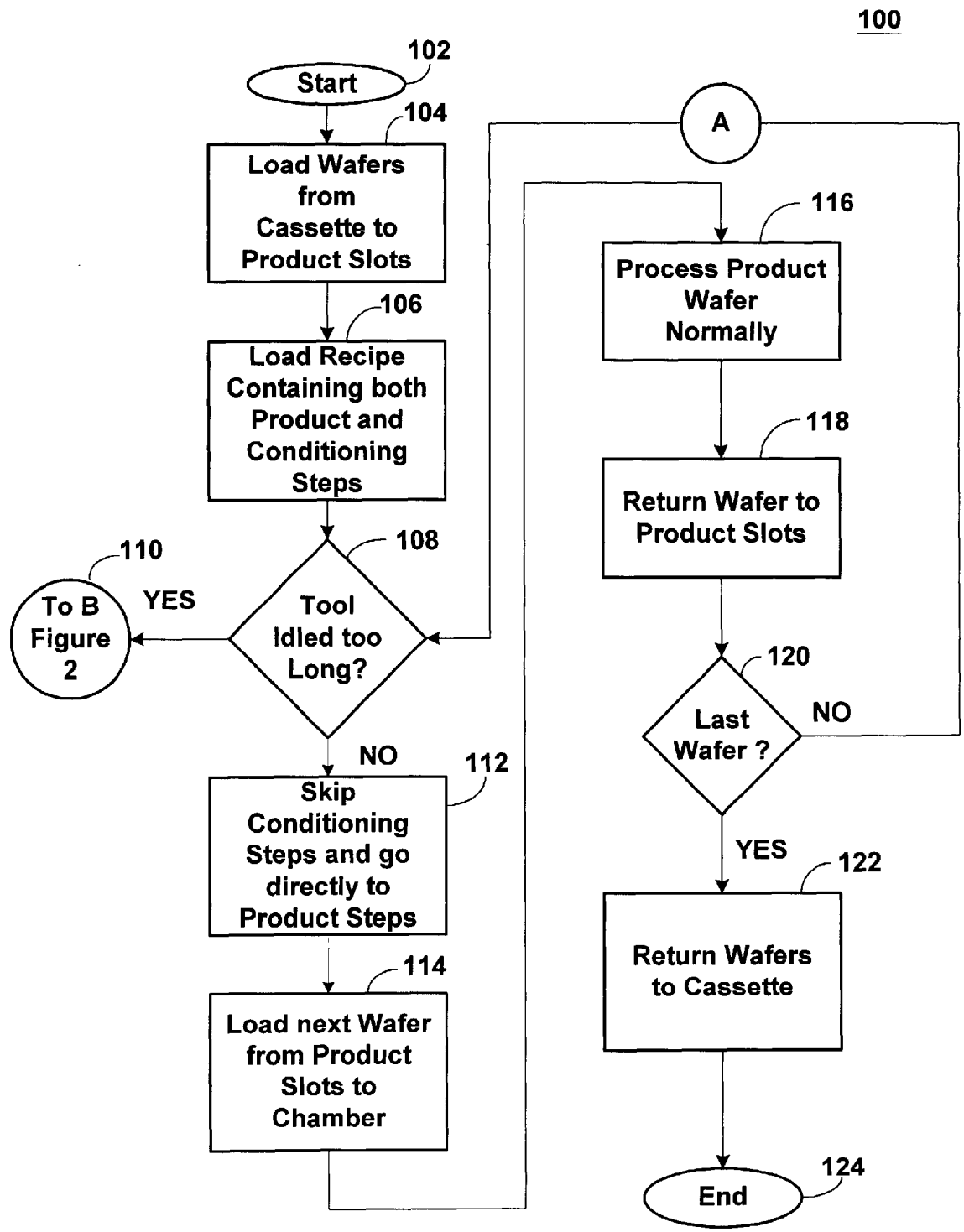
FIG. 1 illustrates a portion of the overall manufacturing process flow in accordance with the present invention.
Figure 2:
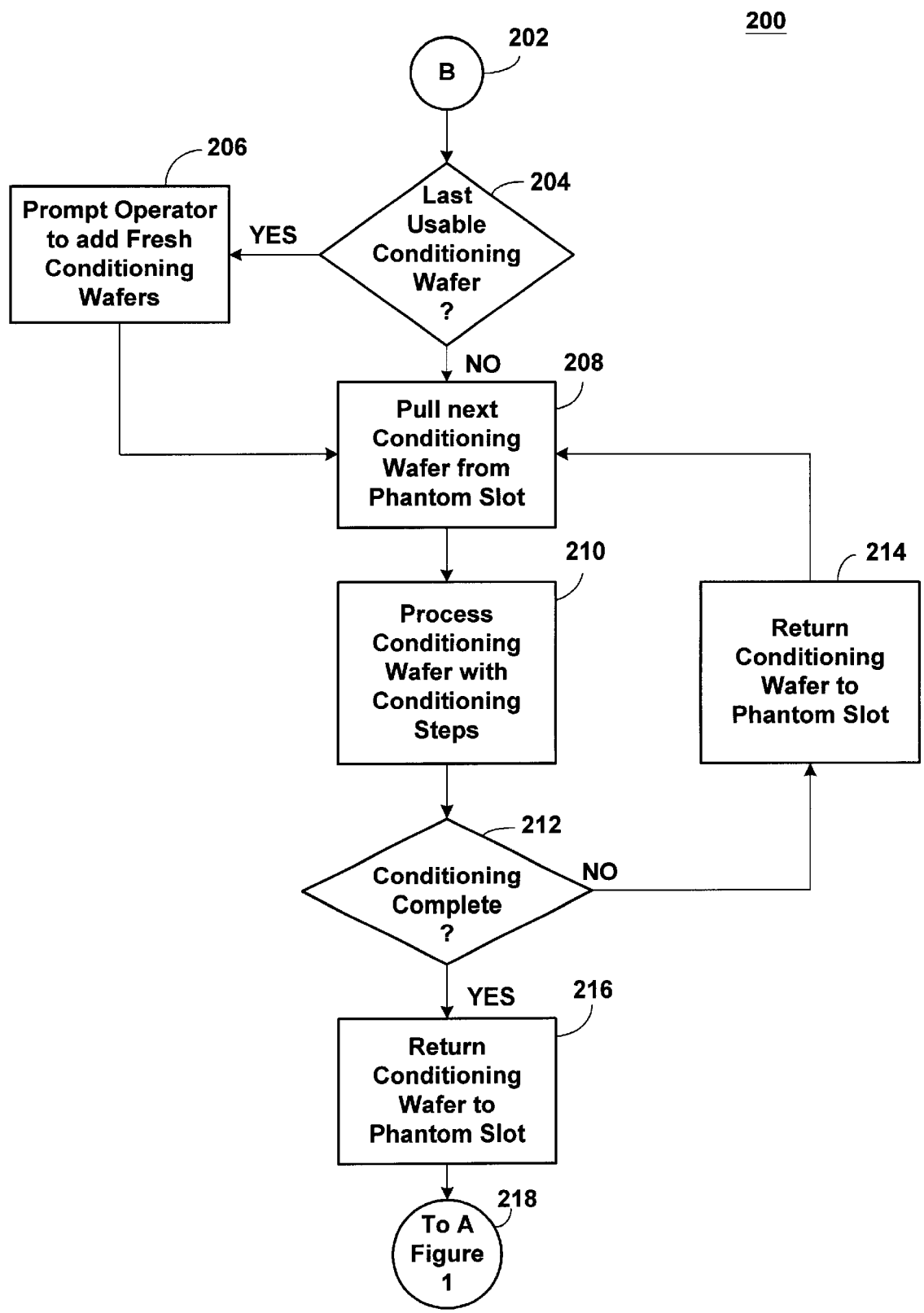
FIG. 2 illustrates a portion of the overall manufacturing process flow when the flow in FIG. 1 has had a tool that has been on idle too long.

FIG. 1 illustrates a portion 100 of an overall manufacturing process flow in accordance with the present invention. The flow starts at 102 and product wafers from a cassette are loaded into product slots in a wafer elevator and wafer handler (to be discussed below) at 104. A recipe containing both product recipe steps and conditioning recipe steps is loaded into the tool at 106. The linking of the conditioning recipe steps with the product recipe steps allows the conditioning recipe steps to be skipped if not needed. Before the first product wafer is processed, a timer determines at 108 if the tool has been idled too long. The timer software parameters are determined by an initial characterization of the particular product and processing tool. If the processing tool has been idled too long, the process flow goes to B in FIG. 2 as indicated at 110. FIG. 2 will be discussed below. The timer monitors the queue time between wafers and is programmed to determine if a conditioning cycle is required. If the system has not been paused, the timer determines that a conditioning cycle is not needed and is skipped. This saves time and decreases costs. If, on the other hand, the system has been paused, for example, due to soft errors such as pressure or temperature being out of tolerance, the time will again determine if the time has elapsed to require another conditioning cycle. If the pause time has exceeded the timer parameters, a conditioning wafer or wafers will be cycled for the appropriate length of time prior to the resumption of product wafer processing.

If the timer determines at 108 that the tool has not been idled for too long a time period, the process skips any conditioning steps and goes directly to the product steps as indicated at 112. The process continues at 114 where the first or next wafer is loaded from product slots in the wafer elevator and wafer handler into the processing tool chamber and the wafer is processed normally as indicated at 116. After the wafer is processed at 116, it is returned to a product slot at 118.

It is determined at 120 whether the wafer just processed is the last wafer to be processed. If it is determined at 120 that the wafer just processed is not the last wafer, the process flow returns to the determination at 108 of whether the tool has been idled too long and the process continues as described above. If it is determined at 120 that the wafer just processed is the last wafer, the wafers are returned to the appropriate cassette at 122 and the process is complete as indicated at 124.

FIG. 2 illustrates a portion 200 of the overall manufacturing process flow when it is determined at 108 in FIG. 1 that the tool has been idled too long and the flow is directed at 110 to B in FIG. 2. FIG. 2 receives the flow from FIG. 1 at 202. It is determined at 204 if there is a conditioning wafer available for use. If there is not a conditioning wafer available, the system prompts the operator at 206 to replenish the supply of conditioning wafers. If there is a conditioning wafer available, a conditioning wafer is retrieved from a phantom slot at 208 and is processed at 210 using the conditioning steps from the recipe that was loaded into the tool at 106 (FIG. 1). It is determined at 212 if the conditioning is complete. If the conditioning is not complete the conditioning wafer being used is returned to a phantom slot at 214 and the next conditioning wafer is retrieved from a phantom slot at 208. The steps 210, 212 and 214 are repeated until it is determined at 212 that the conditioning is complete. When it is determined at 212 that the conditioning is complete, the condition wafer is returned to a phantom slot at 216 and the flow returns to A FIG. 1 as indicated at 218.

Figure 3:
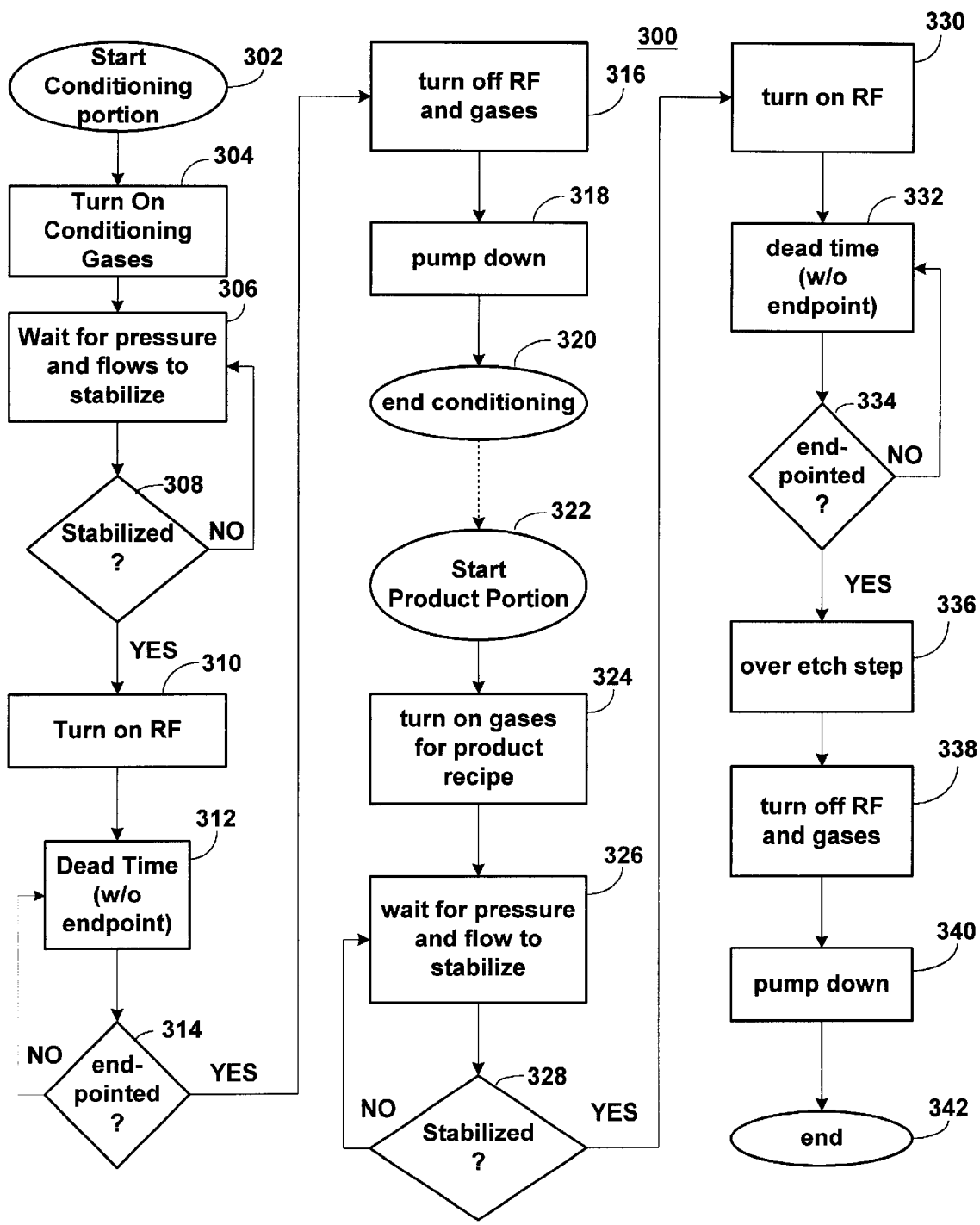
FIG. 3 illustrates a typical process flow using a process recipe that includes conditioning steps.

FIG. 3 illustrates a typical process flow 300 that runs conditioning recipe steps prior to running the process recipe steps. The start of the process begins at 302 with the process starting the conditioning portion of the recipe. At 304 the conditioning gases are turned on, the process waits for the pressure and gas flows in the chamber to stabilize at 306. It is determined at 308 if the chamber is stabilized. If the chamber is not stabilized the flow returns to 306 until it is determined at 308 that the chamber is stabilized. When it is determined at 308 that the chamber is stabilized, the RF is turned on at 310. The step at 312 is dead time, indicating the process has not reached an endpoint. The step at 314 determines if the process has reached an endpoint. If it is determined that the process is not endpointed, the process returns to 312 until it is determined at 314 that the process is endpointed. When it is determined at 314 that the process is endpointed, the RF and the gases are turned off, as indicated at 316. The chamber is pumped down at 318 and when the chamber is pumped down, the conditioning is finished as indicated at 320.

When the conditioning is finished, the product portion of the process is started as indicated at 322. The gases in accordance with the product recipe are turned on at 324 and the process waits for the pressure and flow to stabilize as indicated at 326 and 328. If it is determined at 328 that the pressure and flow are not stabilized the flow cycles back to 326 until it is determined at 328 that the pressure and flow are stabilized. When it is determined at 328 that the pressure and flow are stabilized, the RF is turned on at 330. The step at 332 is dead time, indicating the process has not reached an endpoint. The step at 334 determines if the process has reached an endpoint. If it is determined that the process is not endpointed, the process returns to 332 until it is determined at 334 that the process is endpointed. When it is determined at 334 that the process is endpointed, an overetch step is performed at 336. After the overetch step at 336 is performed, the RF and gases are turned off at 338, the chamber is pumped down at 340 and the process is finished as indicated at 342. It is noted that the conditioning portion of the process is automatically started without a determination of whether the conditioning portion is needed. The running of the conditioning cycle if it is not needed unnecessarily slows down the process and decreases throughput.

The present invention utilizes the already existing endpoint detectors in the system to monitor the amount of residual etchants or polymer forming gas mixtures. The endpoint detectors determine the conditioning wafer cycle based on the detectable residual gases when the RF is struck. This scheme eliminates the need for shuffling several conditioning wafers into a fixed time conditional cycle and speeds up the process.

Figure 4:
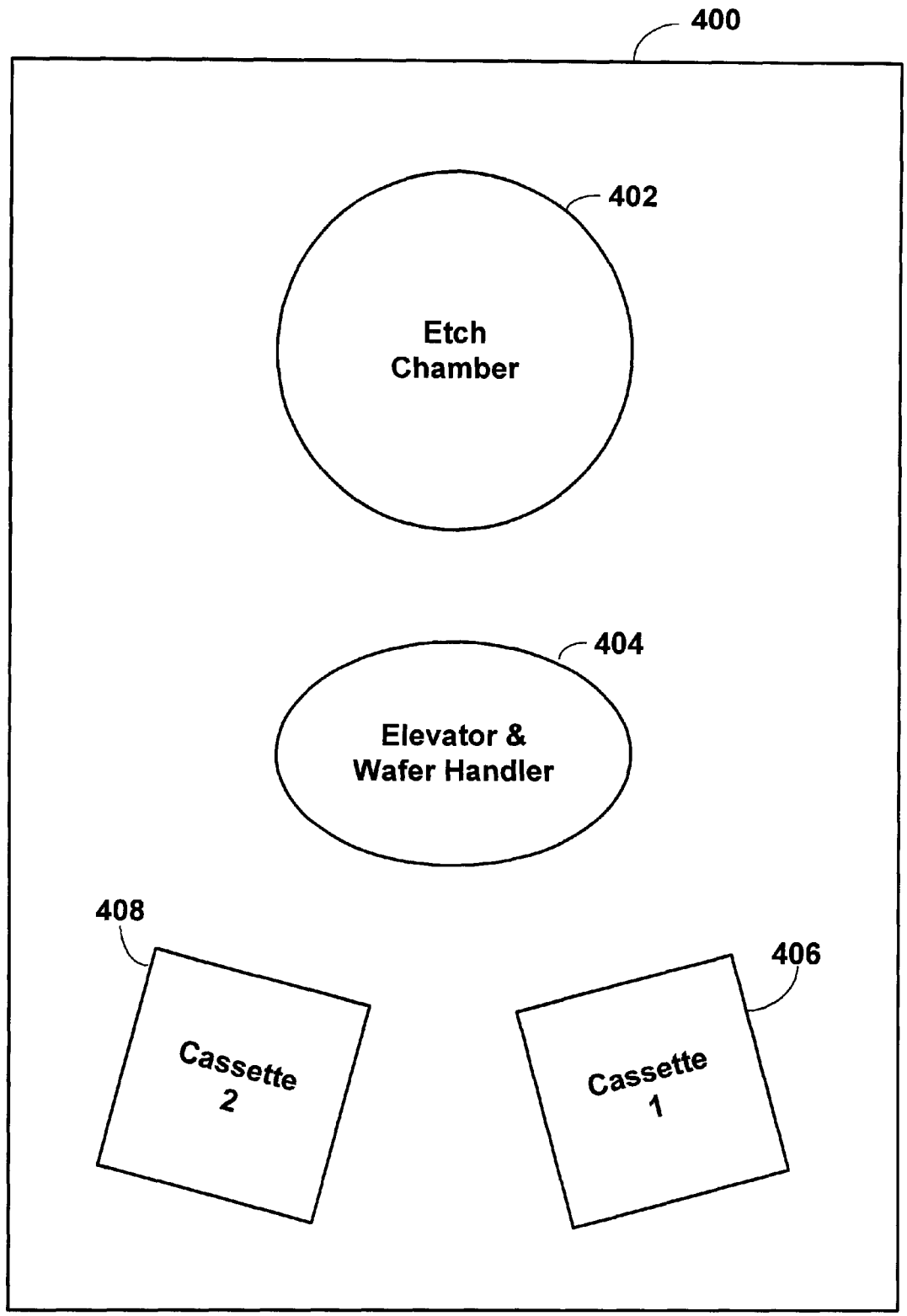
FIG. 4 is an overview of a tool such as an etch tool showing an etch chamber, elevator and wafer handler and cassette no. 1 and cassette no. 2.

FIG. 4 is an overview of a tool 400 such as an etch tool showing an etch chamber 402, an elevator and wafer handler 404 and first and second cassettes, 406 and 408, respectively. The elevator and wafer handler have mechanical components (not shown) that retrieve wafers from the cassettes 406, 408 and place them into the etch chamber 402 and then retrieve them from the etch chamber 402 and place them back into the cassettes 406, 408.

Figure 5:
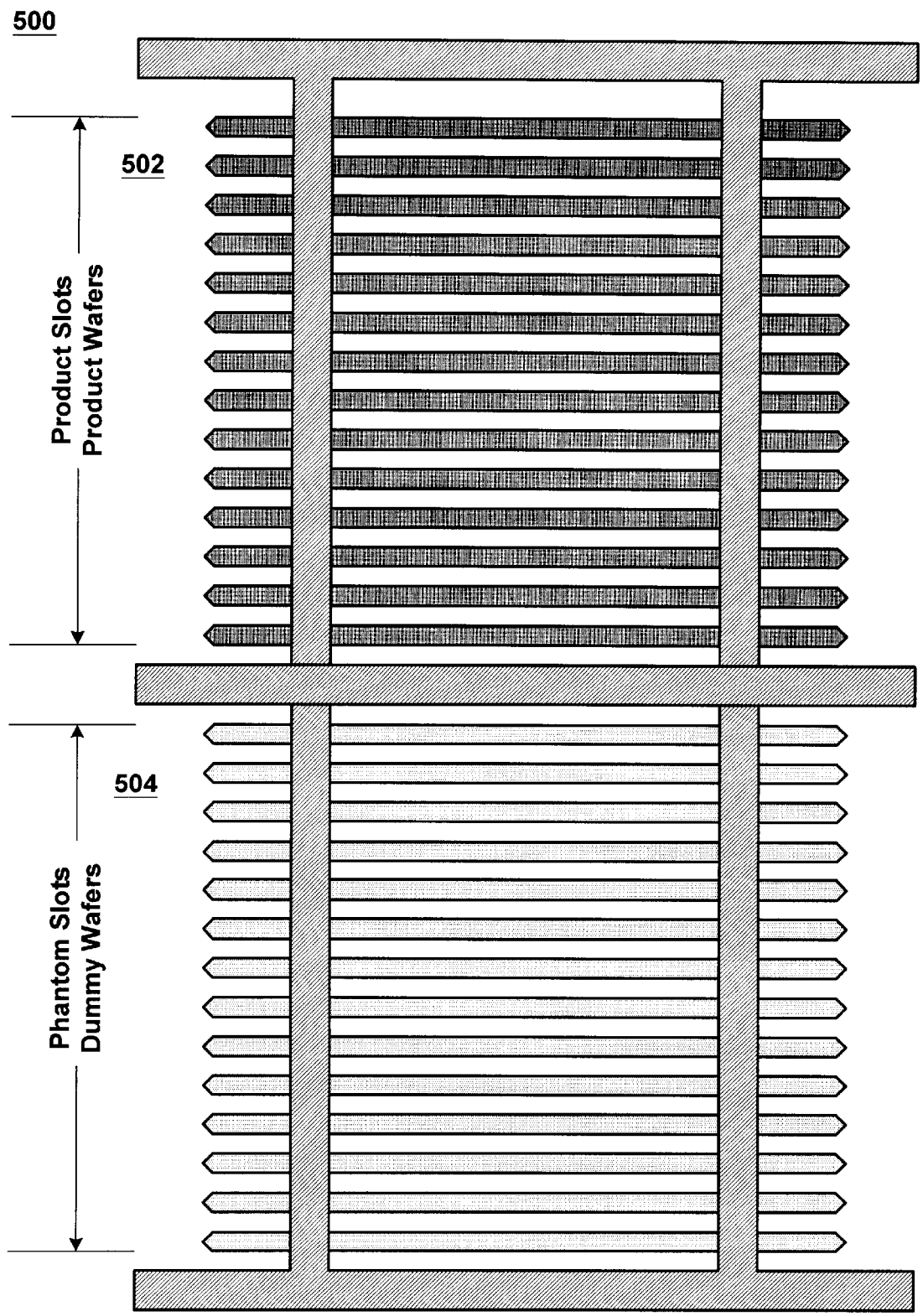
FIG. 5 is a side view of a wafer elevator showing product slots for product wafers and phantom slots for dummy wafers.

FIG. 5 shows a wafer storage system 500 that is part of the load lock area (the elevator). The wafer storage system 500 has a first section 502 that holds product wafers and a second section 504 has "phantom slots" that are apparent only to the conditioning portion of the recipe and holds "dummy wafers." Because the elevator is under constant vacuum except when wafers are loaded and unloaded from the cassettes, the unprocessed wafers are protected from corrosion and condensation as discussed above.

It should be noted that both etch and deposition tools share similar integrated parts, this invention is intended to apply to a deposition tool as well as to an etch tool.

The benefits of this invention include the following:
1. It provides consistent prevention of first-wafer affect.
2. It eliminates multiple first-wafer affects after tool is resumed from soft errors.
3. It eliminates excessive manual wafer handling.
4. It eliminates the need to unload the batch of wafers in process to load the conditioning wafer.
5. It eliminates guesswork on the part of the tool operator.
6. It provides higher yield and fewer scrap wafers.

In summary, the results and advantages of the method of the present invention can now be fully realized. The described method provides a method of manufacturing semiconductor devices automatically without running unnecessary conditioning wafers thus saving processing time and increasing throughput.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor wafers in a processing tool, the method comprising:
   (a) placing at least one cassette with product wafers into the processing tool;
   (b) loading wafers from the cassette to product slots in an elevator, wherein the elevator also contains phantom slots holding conditioning wafers;
   (c) loading a processing recipe containing conditioning steps and product steps into the processing tool;
   (d) determining if the processing tool has been on idle longer than a predetermined period of time;
   (e) loading a product wafer from the elevator into a processing chamber if the time period in step (d) does not exceed tile predetermined period of time;
   (f) processing tile product wafer;
   (g) loading a conditioning wafer from a phantom slot in the elevator into the processing chamber if the time period in step (d) exceeds the predetermined period of time; and
   (h) processing the conditioning wafer.

2. The method of claim 1 further comprising:
   (i) returning the product wafer to a product slot in the elevator upon completion of step (f); and
   (j) repeating steps (d) through (j) until all product wafers are processed.

3. The method of claim 2 further comprising:
   (k) determining if conditioning is complete upon completion of step (h);
   (l) returning the conditioning wafer to the elevator if the conditioning is determined to be complete in step (k); and
   (m) repeating steps (d) through (m).

4. The method of claim 3 further comprising:
   (n) returning the conditioning wafer to the elevator if the conditioning is determined not to be complete in step (k);
   (o) loading a next conditioning wafer from the elevator into the processing chamber;
   (p) processing the next conditioning wafer; and
   (q) repeating steps (k) through (q).

* * * * *